United States Patent [19]
Maekawa

[11] Patent Number: 6,002,175
[45] Date of Patent: *Dec. 14, 1999

[54] SEMICONDUCTOR DEVICE WITH IMPROVED CONNECTION HOLE FOR EMBEDDING AN ELECTRICALLY CONDUCTIVE LAYER PORTION

[75] Inventor: Kazuyoshi Maekawa, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/618,304

[22] Filed: Mar. 18, 1996

[30] Foreign Application Priority Data

Oct. 5, 1995 [JP] Japan ..................................... 7-258523

[51] Int. Cl.⁶ .............................. H01L 23/54; H01L 23/48
[52] U.S. Cl. .......................... 257/760; 257/759; 257/763; 257/764; 257/774
[58] Field of Search ..................................... 257/759, 760, 257/763, 764, 774, 765, 915, 751

[56] References Cited

U.S. PATENT DOCUMENTS

| | | | |
|---|---|---|---|
| 4,809,055 | 2/1989 | Ishibashi et al. | 257/774 |
| 5,091,768 | 2/1992 | Yamazaki | 357/71 |
| 5,200,808 | 4/1993 | Koyama et al. | 257/760 |
| 5,308,793 | 5/1994 | Taguchi et al. | 438/642 |
| 5,464,794 | 11/1995 | Lur et al. | 257/774 |
| 5,572,072 | 11/1996 | Lee | 257/764 |

FOREIGN PATENT DOCUMENTS

| | | |
|---|---|---|
| 0 512 296 | 11/1992 | European Pat. Off. |
| 256152 | 10/1989 | Japan . |
| 0031445 | 2/1990 | Japan . |
| 0082655 | 4/1993 | Japan . |
| 0089941 | 3/1994 | Japan ..................................... 257/774 |
| 0333874 | 12/1994 | Japan . |
| 0503106 | 3/1995 | Japan . |

OTHER PUBLICATIONS

G.A. Dixit, et al. "A Novel High Pressure Low Temperature Aluminum Plug Technology For Sub–0.5 μm Contact/Via Geometries", *IEEE*, 1994, pp. 105–108.

*Primary Examiner*—Wael M. Fahmy
*Assistant Examiner*—Hung Van Duong
*Attorney, Agent, or Firm*—Oblon, Spivak, McClelland, Maier & Neustadt, P.C.

[57] ABSTRACT

A semiconductor device comprising a first electrically conductive layer formed on a semiconductor element or on one main surface of a semiconductor substrate, an insulating layer formed on said first electrically conductive layer through which a connection hole of which diameter is the smallest in a portion other than the bottom is formed, and a second electrically conductive layer formed on said insulating layer.

9 Claims, 13 Drawing Sheets

SEMICONDUCTOR DEVICE WITH IMPROVED CONNECTION HOLE FOR EMBEDDING AN ELECTRICALLY CONDUCTIVE LAYER PORTION

BACKGROUND OF THE INVENTION

1. Field of the Invention

The present invention relates to a semiconductor device and a method for manufacturing the same, particularly to the structure of a connection hole in which a second electrically conductive layer is embedded for electric connecting a first electrically conductive layer and the second electrically conductive layer with an insulating layer between them and to sputtering used for forming the embedded second electrically conductive layer.

2. Description of the Related Art

Recently, as a semiconductor element is miniaturized, the size of a connection hole formed through an insulating layer for electric connecting a first electrically conductive layer consisting of a conductive diffusion layer formed on one main surface of a semiconductor substrate or a metallic film formed on a semiconductor element and a second electrically conductive layer consisting of a metallic film formed on the insulating layer between both layers has been also miniaturized.

As the aspect ratio (a ratio of height of a connection hole to the diameter) of a connection hole is larger as the connection hole is miniaturized, electric connection between the first and second electrically conductive layers enabled by embedding the second electrically conductive layer in the above-described connection hole by keeping in ambient atmosphere of high temperature and pressure after a portion over a space is blocked by the second electrically conductive layer formed by sputtering with the space left inside the connection hole is discussed.

Referring to FIGS. 3, 5 and 38, a method for manufacturing a semiconductor device wherein a first electrically conductive layer formed on a semiconductor element and a second electrically conductive layer are electrically connected by embedding the second electrically conductive layer in the above-described connection hole by keeping in ambient atmosphere of high temperature and pressure after a portion over a space is blocked by the second electrically conductive layer formed by sputtering as described above with the space left inside the connection hole, for example a method disclosed in Published unexamined patent application No. Hei. 7-503,106 will be described below.

First, as shown in FIG. 35, a first electrically conductive layer 2 is formed on a semiconductor element 1, an insulating layer 3 is formed on the first electrically conductive layer and a connection hole 4 is formed through the insulating layer 3.

Next, as shown in FIG. 36, a second electrically conductive layer 6 is deposited on the above-described insulating layer 3 and inside the connection hole 4 by sputtering. At this time, as shown in FIG. 36, the second electrically conductive layer 6 deposited on a side wall 4a and the bottom 4b of the connection hole 4 is thinner than the second electrically conductive layer deposited on the insulating layer 3.

When the second electrically conductive layer 6 is further deposited by sputtering, a gap 7 between the second electrically conductive layers over the connection hole 4 is blocked with a space 8 left inside the connection hole 4 as shown in FIG. 37.

Next, the second electrically conductive layer 6 is embedded in the connection hole 4 by keeping in ambient atmosphere of high pressure until it is in a condition shown in FIG. 38.

As in the semiconductor device manufactured as described above, the second electrically conductive layer is embedded in the above-described connection hole 4 by applying high temperature and pressure after a portion over a space 8 is blocked by the second electrically conductive layer 6 formed by sputtering with the space 8 left inside the connection hole 4, the first electrically conductive layer 2 and the second electrically conductive layer 6 can be electrically connected via the connection hole 4.

However, in a method for manufacturing the semiconductor device constituted as described above wherein the second electrically conductive layer 6 is embedded in the above-described connection hole 4 by applying high temperature and pressure after a portion over a space 8 is blocked by the second electrically conductive layer 6 formed by sputtering with the space 8 left inside the connection hole 4, the thickness of the second electrically conductive layer 6 is required to be approximately twice as thick as the diameter of the connection hole 4, and it takes a long time to embed the second electrically conductive layer in the connection hole. A satisfactory characteristic of embedding the second electrically conductive layer 6 in the connection hole 4 cannot be obtained and therefore, stable electric characteristics and reliability can be hardly obtained.

SUMMARY OF THE INVENTION

The present invention is made to solve the above-described problems and the object of the present invention is to provide a semiconductor device and a method for manufacturing the same wherein a characteristic of embedding a second electrically conductive layer in a connection hole formed through an insulating layer for electrically connecting a first electrically conductive layer and the second electrically conductive layer formed on the first electrically conductive layer through the insulating layer is enhanced.

A semiconductor device according to the present invention is provided with a first electrically conductive layer formed on a semiconductor element or on one main surface of a semiconductor substrate, an insulating layer formed on the first electrically conductive layer through which a connection hole of which diameter is the smallest in a portion other than the bottom is formed and a second electrically conductive layer formed on the insulating layer.

Another semiconductor device according to the present invention is provided with a first electrically conductive layer formed on a semiconductor element or on one main surface of a semiconductor substrate, an insulating layer formed on the first electrically conductive layer through which a connection hole provided with a convex portion on its side wall is formed and a second electrically conductive layer formed on the insulating layer.

A method for manufacturing a semiconductor device according to the present invention comprises a step in which a first electrically conductive layer is formed on a semiconductor element or on one main surface of a semiconductor substrate, a step in which an insulating layer is formed on the above-described first electrically conductive layer, a step in which a connection hole is formed through the above-described insulating layer, a step in which a second electrically conductive layer is formed on the above-described insulating layer by sputtering and a step in which the second electrically conductive layer is embedded in the above-described connection hole by applying pressure to the above-described second electrically conductive layer, and the above-described connection hole is formed in such a shape that the above-described second electrically conductive layer can cover a portion over a space with the space left inside the connection hole.

Another method comprises a step in which a first electrically conductive layer is formed on a semiconductor element or on one main surface of a semiconductor substrate, a step in which an insulating layer is formed on the above-described first electrically conductive layer, a step in which a connection hole of which angular aperture is 85 to 100° is formed through the above-described insulating layer, a step in which a second electrically conductive layer is formed on the above-described insulating layer by sputtering and a step in which the second electrically conductive layer is embedded in the above-described connection hole by applying pressure to the above-described second electrically conductive layer.

The other method comprises a step in which a first electrically conductive layer is formed on a semiconductor element or on one main surface of a semiconductor substrate, a step in which an insulating layer is formed on the above-described first electrically conductive layer, a step in which a connection hole is formed through the above-described insulating layer so that the side wall is provided with a convex portion, a step in which a second electrically conductive layer is formed on the above-described insulating layer by sputtering and a step in which the second electrically conductive layer is embedded in the above-described connection hole by applying pressure to the above-described second electrically conductive layer.

Further the other method comprises a step in which a first electrically conductive layer is formed on a semiconductor element or on one main surface of a semiconductor substrate, a step in which an insulating layer is formed on the above-described first electrically conductive layer, a step in which a connection hole is formed through the above-described insulating layer, a step in which a second electrically conductive layer is formed on the above-described insulating layer by sputtering in which the ratio of particles sputtered at an incident angle other than a perpendicular one to the surface of the above-described insulating layer is large and a step in which the second electrically conductive layer is embedded in the above-described connection hole by applying pressure to the above-described second electrically conductive layer.

Further the other method comprises a step in which a first electrically conductive layer is formed on a semiconductor element or on one main surface of a semiconductor substrate, a step in which an insulating layer is formed on the above-described first electrically conductive layer, a step in which a connection hole is formed through the above-described insulating layer, a step in which a second electrically conductive layer is formed on the above-described insulating layer by sputtering in which the distance between the surface of a sputter target and the surface of the above-described insulating layer is set to 10 to 50 mm and a step in which the second electrically conductive layer is embedded in the above-described connection hole by applying pressure to the above-described second electrically conductive layer.

Further the other method comprises a step in which a first electrically conductive layer is formed on a semiconductor element or on one main surface of a semiconductor substrate, a step in which an insulating layer is formed on the above-described first electrically conductive layer, a step in which a connection hole is formed through the above-described insulating layer, a step in which a second electrically conductive layer is formed on the above-described insulating layer by sputtering of which pressure is set to 10 to 100 mTorr and a step in which the second electrically conductive layer is embedded in the above-described connection hole by applying pressure to the above-described second electrically conductive layer.

Furthermore the other method comprises a step in which a first electrically conductive layer is formed on a semiconductor element or on one main surface of a semiconductor substrate, a step an insulating layer is formed on the above-described first electrically conductive layer, a step in which a connection hole is formed through the above-described insulating layer, a step in which a second electrically conductive layer is formed on the above-described insulating layer by sputtering in which the surface of a sputter target consists of 110 faces and a step in which the second electrically conductive layer is embedded in the above-described connection hole by applying pressure to the above-described second electrically conductive layer.

DESCRIPTION OF THE PREFERRED EMBODIMENTS

First Embodiment

Figure 1:
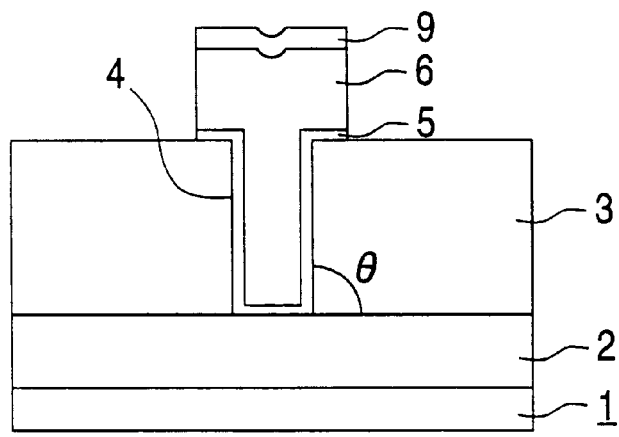
FIG. 1 is a longitudinal section of a main part showing a first embodiment according to the present invention.

Referring to FIGS. 1 to 10, a first embodiment according to the present invention will be described below. FIG. 1 is a sectional view of a main part showing the first embodiment according to the present invention. A reference number 1 in FIG. 1 designates a semiconductor element and for example, it includes a conductive impurity diffused layer formed on one main surface of a semiconductor substrate consisting of a silicon substrate and an insulating layer consisting of a silicon oxide film formed on the above-described impurity diffused layer. A reference number 2 designates a first electrically conductive layer formed on the above-described semiconductor element 1 and for example, it is a wiring layer consisting of an alloy of Al and Cu of 0.5 wt %. A reference number 3 designates an insulating layer formed on the above-described first electrically conductive layer 2, through the insulating layer a connection hole 4 of which an angular aperture $\theta$ is 85 to 100° is formed and for example, the insulating layer consists of a layer insulating film into which a silicon oxide film formed by TEOS or silane by a process such as plasma CVD and atmospheric CVD and organic or inorganic SOG are combined.

A reference number 5 designates a barrier layer formed on the first electrically conductive layer 2 equivalent to the bottom 4b of the connection hole 4 and on the insulating layer 3, and for example, it is a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å or depositing Ti to the thickness of 300 to 30 Å by sputtering. A reference number 6 designates a second electrically conductive layer embedded inside the connection hole 4 and electrically connected to the first electrically conductive layer 2 via the barrier layer 5, and for example, the second electrically conductive layer is a wiring layer formed by an alloy of Al and Cu of 0.5 wt %. A reference number 9 designates an antireflection film formed on the second electrically conductive layer 6 and for example, the film is formed by depositing TiN to the thickness of 200 to 600 Å by sputtering.

Next, referring to FIGS. 2 to 10, a process of the semiconductor device constituted as described above will be described. FIGS. 2 to 10 show a process of the semiconductor device according to the first embodiment of the present invention serially.

Figure 2:
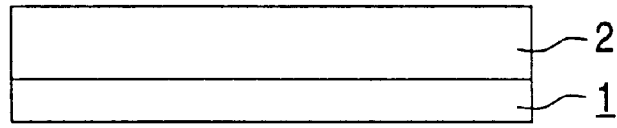
FIG. 2 is a longitudinal section of a main part showing a first embodiment according to the present invention in the order of the process.

First, as shown in FIG. 2, a first electrically conductive layer 2, for example a wiring layer formed by an alloy of Al and Cu of 0.5 wt % is formed on a semiconductor element 1 comprising a conductive impurity diffused layer formed on one main surface of a semiconductor substrate consisting of a silicon substrate and an insulating layer consisting of a silicon oxide film on the above-described impurity diffused layer by sputtering.

Figure 3:
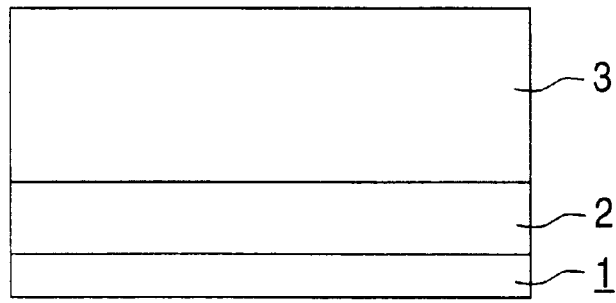
FIG. 3 is a longitudinal section of a main part showing a first embodiment according to the present invention in the order of the process.

Next, as shown in FIG. 3, an insulating layer 3, for example a layer insulating layer into which a silicon oxide film formed by TEOS or silane by a process such as plasma CVD and atmospheric CVD and organic or inorganic SOG are combined is formed on the first electrically conductive layer 2.

Figure 4:
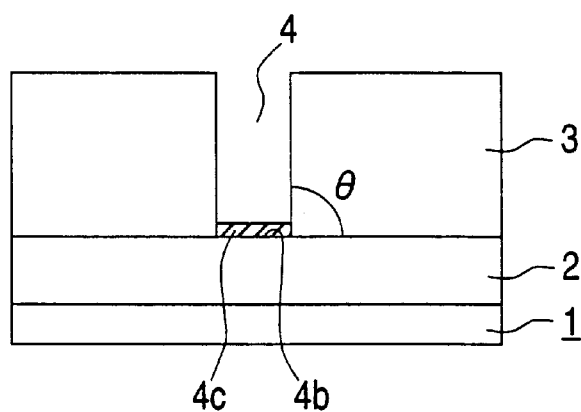
FIG. 4 is a longitudinal section of a main part showing a first embodiment according to the present invention in the order of the process.

Next, as shown in FIG. 4, a connection hole 4 of which an angular aperture $\theta$ is 85 to 100° is formed through the above-described insulating layer 3 using a photoengraving process, for example by etching such as RIE.

Next, after the above-described connection hole 4 is formed, water, nitrogen, hydrogen or an organic substance clinging to the surface of the above-described semiconductor device in a process is removed by heating (hereinafter called degassing). In the concrete, such a substance is removed by heating the above-described semiconductor device in a process to the temperature of 150 to 600° C. in high vacuum $10^{-5}$ Torr or less or an ambient atmosphere 0.5 to 50 mTorr of inert gas such as Ar.

At this time, if necessary, a natural oxide film 4c formed on the first electrically conductive layer 2 equivalent to the bottom 4b of the connection hole is removed in a condition in which high vacuum $10^{-5}$ Torr or less is kept (hereinafter called vacuum continuity) by a process such as sputter etching. In the concrete, such a natural oxide film is removed on the condition of RF power of 100 to 700 W and DC bias of 40 to 600 V in an ambient atmosphere 0.1 to 3 mTorr of Ar.

Figure 5:
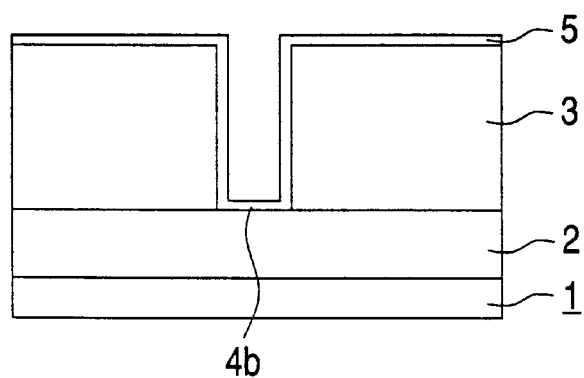
FIG. 5 is a longitudinal section of a main part showing a first embodiment according to the present invention in the order of the process.

Next, as shown in FIG. 5, a barrier layer 5 is formed on the first electrically conductive layer 2 equivalent to the bottom 4b of the connection hole and the insulating layer 3 in vacuum continuity by sputtering. The barrier layer 5 is constituted, for example by a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å or depositing Ti to the thickness of 300 to 30 Å.

Figure 6:
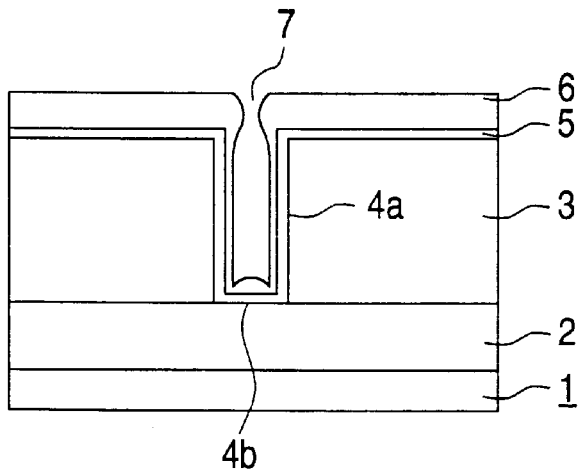
FIG. 6 is a longitudinal section of a main part showing a first embodiment according to the present invention in the order of the process.

Next, as shown in FIG. 6, a second electrically conductive layer 6 consisting of Al and Cu of 0.5% is deposited on the above-described insulating layer 3 and inside the connection hole 4 in vacuum continuity by sputtering.

At this time, the thickness of the second electrically conductive layer 6 deposited on a side wall 4a and the bottom 4b of the connection hole 4 is generally thinner than that of the second electrically conductive layer 6 deposited on the insulating layer 3. When the second electrically conductive layer 6 is further deposited by sputtering, a gap 7 between the second electrically conductive layers 6 over the connection hole 4 is blocked, and at this time, the thickness of the second electrically conductive layer 6 deposited on the insulating layer 3 is generally required to be at least twice as thick as the diameter of the connection hole 4 at the highest point.

However, as an angular aperture θ of the connection hole 4 is set to 85 to 100° in the first embodiment according to the present invention, the gap 7 between the second electrically conductive layers 6 over the connection hole 4 is readily blocked as shown in FIG. 6 even if the thickness of the second electrically conductive layer 6 on the insulating layer 3 is generally thin.

Figure 7:
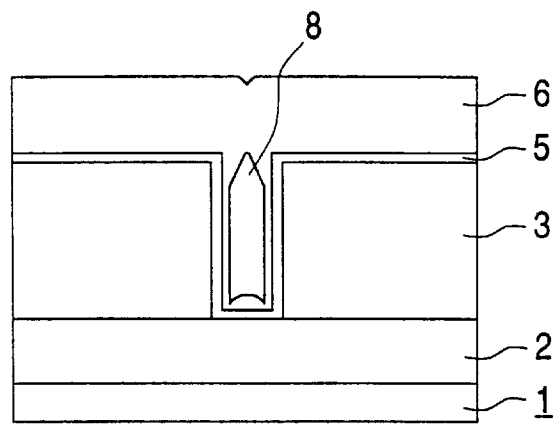
FIG. 7 is a longitudinal section of a main part showing a first embodiment according to the present invention in the order of the process.

When the above-described gap 7 is blocked, a space 8 is left inside the connection hole 4 as shown in FIG. 7.

The above-described space 8 is removed by keeping the second electrically conductive layer 6 under a condition of high temperature and pressure in vacuum continuity. In the concrete, the second electrically conductive layer 6 is kept under the temperature of 300 to 600° C. and the pressure of 200 to 900 kg/cm² in ambient atmosphere of inert gas such as Ar.

Figure 8:
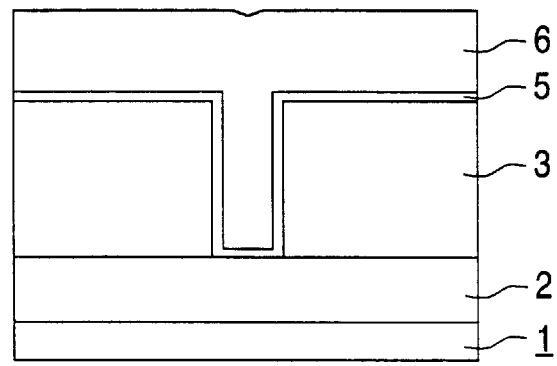
FIG. 8 is a longitudinal section of a main part showing a first embodiment according to the present invention in the order of the process.

The space 8 is removed as shown in FIG. 8 by this and the inside of the connection hole 4 is filled with Al and Cu of 0.5% forming the second electrically conductive layer 6.

Figure 9:
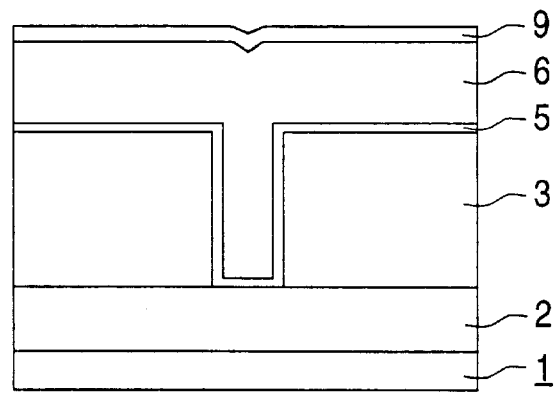
FIG. 9 is a longitudinal section of a main part showing a first embodiment according to the present invention in the order of the process.

Further, if necessary, an antireflection film 9 consisting of TiN 200 to 600 Å is formed on the above-described second electrically conductive layer 6 in vacuum continuity by sputtering as shown in FIG. 9.

Figure 10:
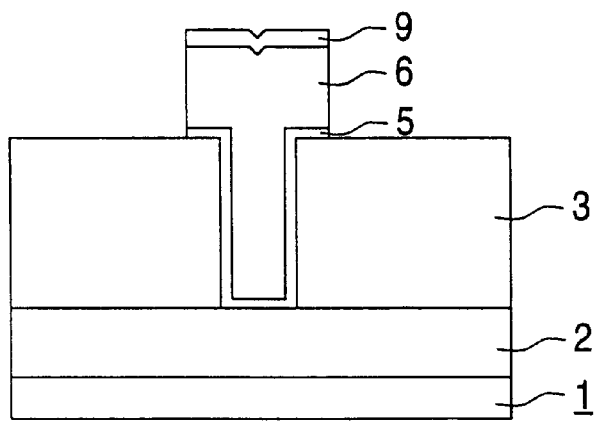
FIG. 10 is a longitudinal section of a main part showing a first embodiment according to the present invention in the order of the process.

Next, the barrier layer 5, the second electrically conductive layer 6 and the antireflection film 9 other than them around over the connection hole are removed by etching such as RIE using a photoengraving process as shown in FIG. 10.

As an angular aperture θ of the connection hole 4 is set to 85 to 100° in a semiconductor device manufactured as described above, the second electrically conductive layer 6 can be readily embedded in the above-described connection hole 4 by applying high temperature and pressure after the top of the space 8 is blocked by the second electrically conductive layer 6 formed by sputtering with the space 8 left inside the connection hole 4, and therefore, a characteristic of embedding the second electrically conductive layer 6 in the connection hole 4 is enhanced.

In the first embodiment according to the present invention, the barrier layer 5 is a laminated film consisting of Ti and its nitride, however, it may be a laminated film consisting of titanium oxide, oxidized titanium nitride, titanium carbide, titanium sulfide or titanium silicide, or a multilayer film consisting of such laminated films.

Further, the barrier layer 5 may be a laminated film consisting of Ta, TiW, W or Mo, or a nitride, an oxide, a nitrided oxide, a carbide, a sulfide or a silicide of them, or a multilayer film consisting of such laminated films.

For a process for forming a barrier layer 5, sputtering is adopted, however, CVD using organic gas including $TiCl_4$ or Ti as material gas may be adopted.

In such a case, the effect equal to the above-described can be also obtained.

In the first embodiment according to the present invention, Al and Cu of 0.5% are used for the second electrically conductive layer 6, however, Cu, Ti, Sc, Pd, Si, Ta, Mn, Mg, Nb, Cr, Co, Ni, Ag, Pt, W, Au or V for 0.01 to 2% for Al may be used in place of Cu of 0.5%, and two or more of the above-described elements for 0.01 to 2% respectively for Al may be used.

Further, Cu, Ag or Pt may be used for the main component of the second electrically conductive layer 6 in place of Al.

In addition, the second electrically conductive layer 6 may be formed by only Cu, Al, Ag or Pt respectively.

In such a case, the effect equal to the above-described can be also obtained.

In the first embodiment according to the present invention, the first electrically conductive layer 2 is a wiring layer formed on the semiconductor element 1, however, it may be a layer in which B, P or As is diffused formed on one main surface of the semiconductor substrate consisting of a silicon substrate. In this case, the insulating layer 3 may be a silicon oxide film formed by TEOS or silane by thermal CVD, a thermal oxide film formed using gas including oxygen, a silicon oxide film and a silicon nitride film such as BPSG and BPTEOS including B or P or a laminated film of these.

In such a case, the effect equal to the above-described can be also obtained.

In the first embodiment according to the present invention, the second electrically conductive layer 6 is formed in vacuum continuity by sputtering after the barrier layer 5 is formed, however, after the barrier layer 5 is formed, the above-described semiconductor device in a process may be exposed to atmospheric pressure, may be annealed and degassed, and if necessary, the second electrically conductive layer 6 may be formed by sputtering after sputter etching and forming a barrier layer again.

For example, the semiconductor device in a process is annealed at the temperature of 450 to 900° C. in ambient atmosphere of $N_2$, $O_2$ or $NH_3$, or mixed gas of two or more of these for 10 to 300 seconds in the case of a rapid thermal anneal and for 10 to 120 minutes in the case of a furnace anneal.

In such a case, after the barrier layer 5 is formed, the semiconductor device in a process may be annealed in vacuum continuity.

In such a case, the effect equal to the above-described can be also obtained.

In the first embodiment according to the present invention, the antireflection film 9 is formed 200 to 600 Å by TiN, however, it may be formed 200 to 600 Å by TiN or Ti and by Ti, Ta, TiW, W or Si, or a nitride, an oxide, an oxidized nitride.

The antireflection film 9 may be formed by CVD in place of sputtering.

In such a case, the effect equal to the above-described can be also obtained.

Second Embodiment

Figure 11:
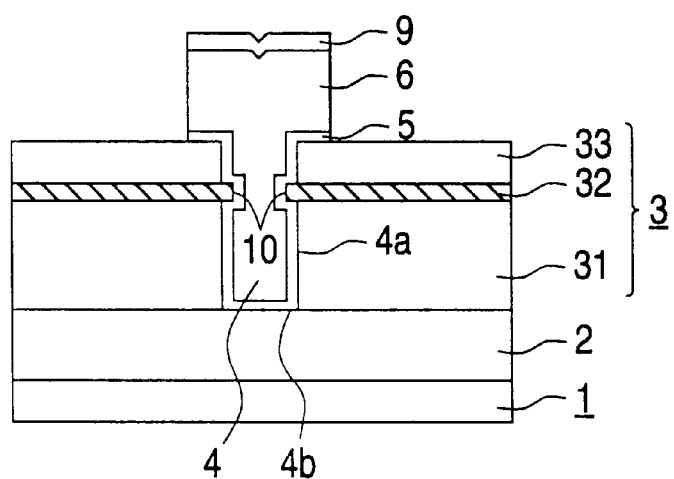
FIG. 11 is a longitudinal section of a main part showing a second embodiment according to the present invention.

Referring to FIGS. 11 to 20, a second embodiment according to the present invention will be described below. FIG. 11 is a longitudinal section showing a main part according to the second embodiment of the present invention, a reference number 1 in FIG. 11 designates a semiconductor element and for example, it comprises a conductive impurity diffused layer formed on one main surface of a semiconductor substrate consisting of a silicon substrate and an insulating layer consisting of a silicon oxide film formed on the above-described impurity diffused layer. A reference number 2 designates a first conductor formed on this semiconductor element 1 and for example, it is a wiring layer consisting of an alloy of Al and Cu of 0.5 wt %.

A reference number 3 designates an insulating layer formed on the above-described first conductor 2 comprising a member 31 of which rate of dry etching is large, a member 32 of which rate of dry etching is small formed on the member 31 and a member 33 of which rate of dry etching is large formed on the member 32, for example the members 31 and 33 of which rate of dry etching is large consist of a layer insulating film into which a silicon oxide film formed by TEOS or silane by plasma CVD or atmospheric CVD and organic or inorganic SOG are combined, and the member 32 of which rate of dry etching is small consists of a layer insulating film into which a silicon nitride film and a silicon nitrided oxide film are combined. For example, the thickness of the member 32 of which rate of dry etching is small is 50 to 1000 Å and the member 32 may be formed in any position on the member 31 if only the member 31 of which rate of dry etching is large is formed 200 to 5000 Å, and for example, may be formed at the highest position of the insulating layer 3.

A reference number 4 designates a connection hole formed through the insulating layer 3 and provided with a convex portion 10 including the above-described member 32 of which rate of dry etching is small on the side wall 4a. A reference number 5 designates a barrier layer formed on the first electrically conductive layer 2 equivalent to the bottom 4b of the connection hole 4 and on the insulating layer 3, and for example, it is a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å, or depositing Ti to the thickness of 300 to 30 Å by sputtering. A reference number 6 designates a second electrically conductive layer embedded inside the connection hole 4 and electrically connected to the first electrically conductive layer 2 via the barrier layer 5, and for example, the second electrically conductive layer is a wiring layer consisting of an alloy of Al and Cu of 0.5 wt %. A reference number 9 designates an antireflection film formed on the second electrically conductive layer 6 and for example, the film consists of TiN deposited to the thickness of 200 to 600 Å by sputtering.

Next, referring to FIGS. 12 to 20, a process of the semiconductor device constituted as describe above will be described. FIGS. 12 to 20 show a process of a semiconductor device according to the second embodiment of the present invention serially.

Figure 12:
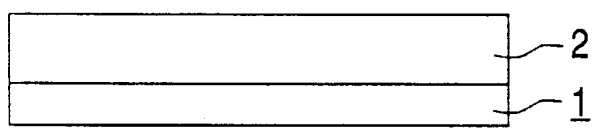
FIG. 12 is a longitudinal section of a main part showing a second embodiment according to the present invention in the order of the process.

First, as shown in FIG. 12, a wiring layer, for example consisting of an alloy of Al and Cu of 0.5 wt % which is a first electrically conductive layer 2 is formed by sputtering on a semiconductor element 1 comprising a conductive impurity diffused layer formed on one main surface of a semiconductor substrate consisting of a silicon substrate and an insulating layer consisting of a silicon oxide film formed on the above-described impurity diffused layer.

Figure 13:
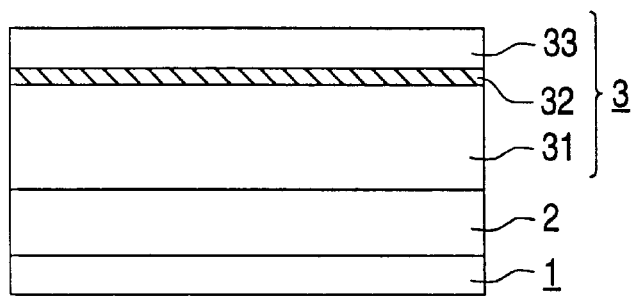
FIG. 13 is a longitudinal section of a main part showing a second embodiment according to the present invention in the order of the process.

Next, as shown in FIG. 13, an insulating layer 3 comprising members 31, 32 and 33 is formed by forming the member 31 of which rate of dry etching is large on the first electrically conductive layer 2, forming the member 32 of which rate of dry etching is small on the member 31 and forming the member 33 of which rate of dry etching is large on the member 32.

In the concrete, the members 31 and 33 of which rate of dry etching is large are formed by a layer insulating film into which a silicon oxide film formed by TEOS or silane by plasma CVD or atmospheric CVD and organic or inorganic SOG are combined. The member 32 of which rate of dry etching is small is formed by a layer insulating film into which a silicon nitride film and a silicon nitrided oxide film are combined.

The member 31 of which rate of dry etching is large is formed so that it is 200 to 5000 Å thick and the member 32 of which rate of dry etching is small formed on the above-described member 31 is formed so that it is 50 to 1000 Å thick. At this time, the member 32 of which rate of dry etching is small may be formed anywhere if only it is formed higher than a half of the thickness of the insulating layer 3, and if it is formed in such a position, the member of which rate of dry etching is small may be formed in a plurality of positions with the member between the members of which rate of dry etching is large. At this time, the member 32 of which rate of dry etching is small may be formed in the highest position of the insulating layer 3.

Figure 14:
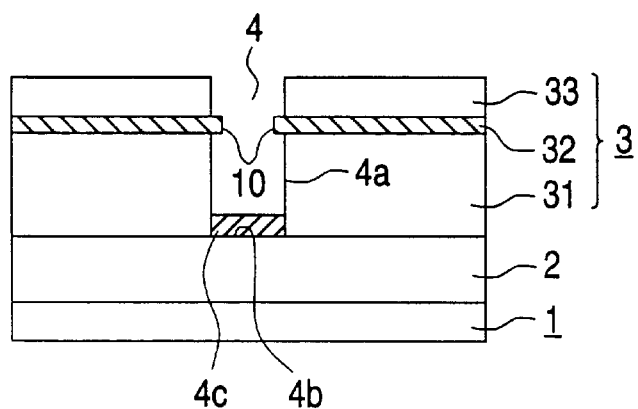
FIG. 14 is a longitudinal section of a main part showing a second embodiment according to the present invention in the order of the process.

Next, as shown in FIG. 14, a connection hole 4 is formed through the above-described insulating layer 3 using a photoengraving process by dry etching such as RIE. At this time, as the member 32 of which rate of dry etching is small is less in an etched amount than the members 31 and 33 of which rate of dry etching is large, a side wall 4a of the connection hole 4 is protruded in a convex shape.

Next, after the above-described connection hole 4 is formed, water, nitrogen, hydrogen or other organic substances clinging to the surface of the above-described semiconductor device in a process are removed by heating. In the concrete, they are removed in high vacuum $10^{-5}$ Torr or less or in ambient atmosphere 5 to 50 mTorr of inert gas such as Ar by heating the above-described semiconductor device in a process to 150 to 600° C.

If necessary, a natural oxide film 4c formed on the first electrically conductive layer 2 equivalent to the bottom 4b of the connection hole is removed by a process such as sputter etching with high vacuum $10^{-5}$ Torr or less kept. In the concrete, the film is removed on the condition of RF power 100 to 700 W and DC bias 40 to 600 V in ambient atmosphere 0.1 to 3 mTorr of Ar.

Figure 15:
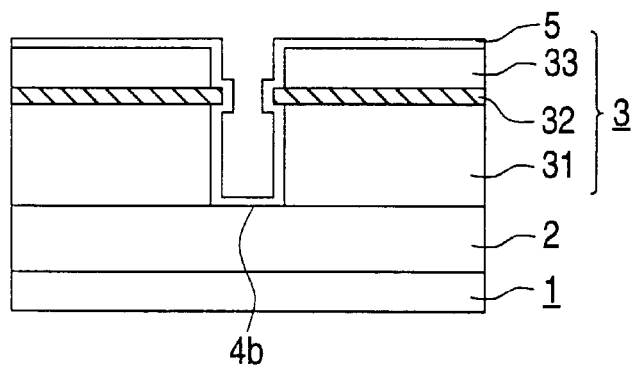
FIG. 15 is a longitudinal section of a main part showing a second embodiment according to the present invention in the order of the process.

Next, as shown in FIG. 15, a barrier layer 5 is formed on the first electrically conductive layer 2 equivalent to the bottom 4b of the connection hole and the insulating layer 3 in vacuum continuity by sputtering. For example, the barrier layer 5 is formed by a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å or depositing Ti to the thickness of 300 to 30 Å.

Figure 16:
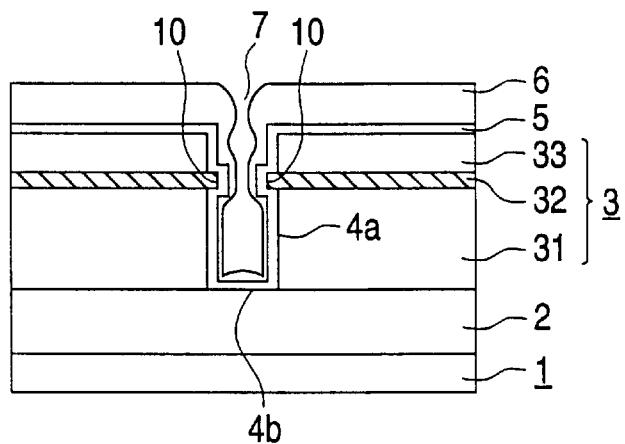
FIG. 16 is a longitudinal section of a main part showing a second embodiment according to the present invention in the order of the process.

Next, as shown in FIG. 16, a second electrically conductive layer 6 consisting of Al and Cu of 0.5% is deposited on the above-described insulating layer 3 and inside the connection hole 4 in vacuum continuity by sputtering.

At this time, the second electrically conductive layer 6 deposited on the side wall 4a and the bottom 4b of the connection hole 4 is generally thinner than the second electrically conductive layer 6 deposited on the insulating layer 3. When the second electrically conductive layer 6 is further deposited by sputtering, a gap 7 between the second electrically conductive layers 6 over the connection hole 4 is blocked, and at this time, the second electrically conductive layer 6 deposited on the insulating layer 3 is generally required to be at least twice as thick as the diameter of the connection hole 4 in the highest position.

However, in the second embodiment according to the present invention, as a convex portion 10 is provided to the side wall 4a of the connection hole 4, a sputtered particle is also deposited on this convex portion 10 and as shown in FIG. 16, the gap 7 between the second electrically conductive layers 6 over the connection hole 4 is readily blocked.

When the second electrically conductive layer 6 is further deposited by sputtering, the gap 7 between the second electrically conductive layers 6 over the connection hole 4 is blocked.

Figure 17:
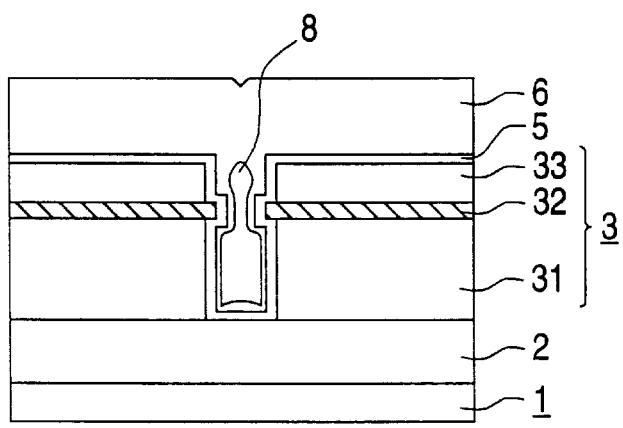
FIG. 17 is a longitudinal section of a main part showing a second embodiment according to the present invention in the order of the process.

Therefore, as shown in FIG. 17, a space 8 is left inside the connection hole 4.

Figure 18:
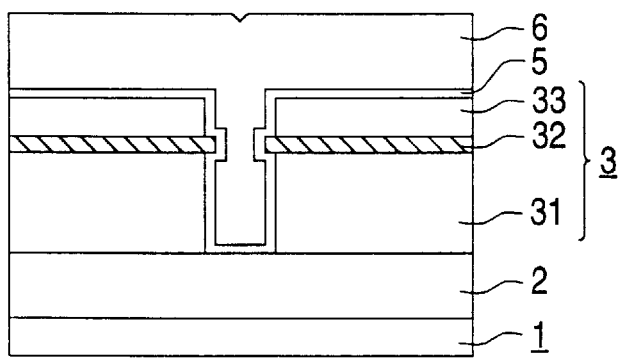
FIG. 18 is a longitudinal section of a main part showing a second embodiment according to the present invention in the order of the process.

As shown in FIG. 18, the above-described space 8 is removed by keeping the second electrically conductive layer 6 in vacuum continuity under high temperature and pressure. In the concrete, it is left in ambient atmosphere of inert gas such as Ar at the temperature of 300 to 600° C. and the pressure of 200 to 900 kg/cm$^2$ for 1 to 20 minutes.

By this, the inside of the connection hole 4 is filled with Al and Cu of 0.5% forming the second electrically conductive layer 6.

Figure 19:
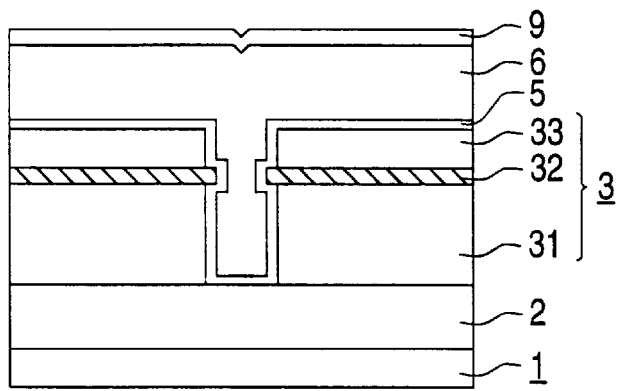
FIG. 19 is a longitudinal section of a main part showing a second embodiment according to the present invention in the order of the process.

Further, if necessary, as shown in FIG. 19, an antireflection film 9 is formed by depositing TiN to the thickness of 200 to 600 Å on the above-described second electrically conductive layer 6 in vacuum continuity by sputtering.

Figure 20:
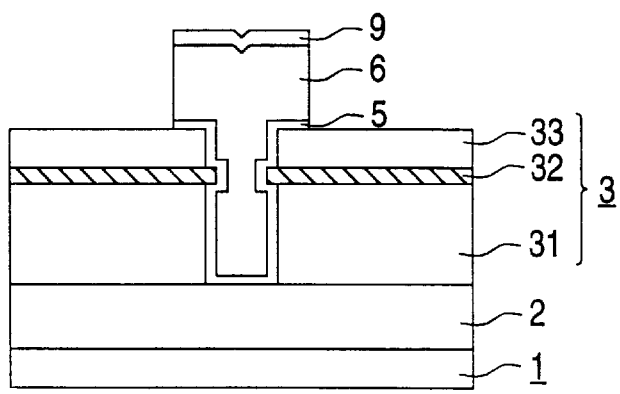
FIG. 20 is a longitudinal section of a main part showing a second embodiment according to the present invention in the order of the process.

Next, as shown in FIG. 20, the barrier layer 5, the second electrically conductive layer 6 and the antireflection film 9 other than around over the connection hole are etched using a photoengraving process by etching such as RIE.

As the convex portion 10 is provided to the side wall 4a of the connection hole 4 in the semiconductor device manufactured as described above, the second electrically conductive layer 6 can be readily embedded in the above-described connection hole 4 by applying high temperature and pressure after a portion over the space 8 is blocked by the second electrically conductive layer 6 formed by sputtering with the space 8 left inside the connection hole 4, and therefore, a characteristic of embedding the second electrically conductive layer 6 in the connection hole 4 is enhanced.

In the second embodiment according to the present invention, the barrier layer 5 is a laminated film of Ti and its nitride, however, it may be a laminated film of an oxide, an oxidized nitride, a carbide, a sulfide or silicide of Ti, or a multilayer film consisting of laminated films.

Further, the barrier layer 5 may be a laminated film of Ta, TiW, W, Mo or an nitride, an oxide, a nitrided oxide, a carbide, a sulfide or a silicide of them, or a multilayer film consisting to laminated films.

The barrier layer 5 is formed by sputtering, however, it may be formed by CVD of organic gas including TiCl$_4$ or Ti.

In such a case, the effect equal to the above-described can be also obtained.

In the second embodiment according to the present invention, the second electrically conductive layer 6 is formed by Al and Cu of 0.5%, however, Cu, Ti, Sc, Pd, Si, Ta, Mn, Mg, Nb, Cr, Co, Ni, Ag, Pt, W, Au, V for 0.01 to 2% for Al may be used in place of Cu of 0.5% and two or more of the above-described elements for 0.01 to 2% for Al may be also used.

Further, Cu, Ag, or Pt may be used as a main component of the second electrically conductive layer 6 in place of Al.

In addition, the second electrically conductive layer 6 may be formed by only Cu, Al, Ag or Pt.

In such a case, the effect equal to the above-described can be also obtained.

In the second embodiment according to the present invention, the first electrically conductive 2 is a wiring layer formed on the semiconductor element 1, however, it may be a layer in which B, P, or As is diffused formed on one main surface of a semiconductor substrate consisting of a silicon substrate. In this case, the members 31 and 33 of which rate of dry etching is large of the insulating layer 3 may be a silicon oxide film formed by TEOS or silane by thermal CVD, a thermal oxide film formed using gas including oxygen, a silicon oxide film and a silicon nitride film such as BPSG and BPTEOS including B and P, or may be a laminated film of these.

In such a case, the effect equal to the above-described can be also obtained.

In the second embodiment according to the present invention, the second electrically conductive layer 6 is formed in vacuum continuity by sputtering after the barrier layer 5 is formed, however, after the barrier layer 5 is formed, the above-described semiconductor device in a process may be exposed to atmospheric pressure, may be annealed and degassed, and if necessary, the second electrically conductive layer 6 may be formed by sputtering after sputter etching and forming a barrier layer again.

In the concrete, the semiconductor device in a process is annealed in ambient atmosphere of, for example N$_2$, O$_2$ or NH$_3$, or mixed gas of two or more of these at the temperature of 450 to 900° C. for 10 to 300 seconds in the case of rapid thermal anneal and for 10 to 120 minutes in the case of furnace anneal.

After the barrier layer 5 is formed, the semiconductor device in a process may be also annealed in vacuum continuity.

In the second embodiment according to the present invention, the antireflection film 9 is formed by depositing TiN to the thickness of 200 to 600 Å, however, it may be formed by depositing TiN or Ti to the thickness of 200 to 600 Å and it may be formed by Ti, Ta, TiW, W or Si, or a nitride, an oxide or an oxidized nitride of them.

It may be also formed by CVD in place of sputtering.

In such a case, the effect equal to the above-described can be also obtained.

Third Embodiment

Figure 21:
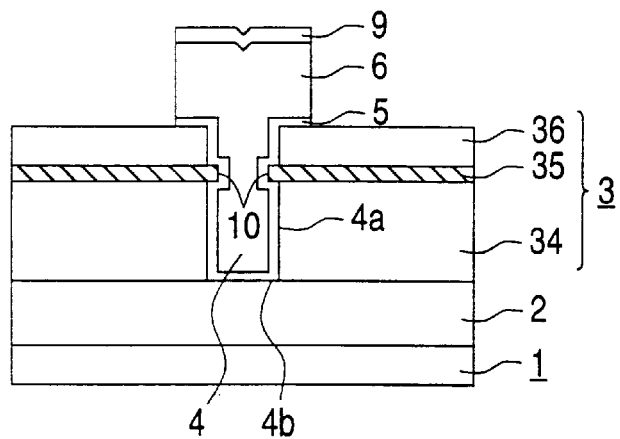
FIG. 21 is a longitudinal section of a main part showing a third embodiment according to the present invention.

Referring to FIGS. 21 to 31, a third embodiment according to the present invention will be described below. FIG. 21 is a longitudinal section showing a main part according to the third embodiment of the present invention, a reference number 1 in FIG. 21 designates a semiconductor element and for example, it comprises a conductive impurity diffused layer formed on one main surface of a semiconductor substrate consisting of a silicon substrate and an insulating layer consisting of a silicon oxide film formed on the above-described impurity diffused layer. A reference number 2 designates a first electrically conductive layer formed on this semiconductor element 1 and for example, it is a wiring layer consisting of an alloy of Al and Cu of 0.5 wt %.

A reference number 3 designates an insulating layer 3 formed on the above-described first electrically conductive layer 2 comprising a member 34 of which rate of wet etching is large, a member 35 of which rate of wet etching is small formed on the member 34 and a member 36 of which rate of wet etching is large formed on the member 35. For example, the members 34 and 36 of which rate of wet etching is large consist of a layer insulating film into which a silicon oxide film formed by TEOS or silane by plasma CVD or atmospheric CVD and organic or inorganic SOG are combined, and the member 35 of which rate of wet etching is small consists of a layer insulating film into which a silicon nitride film and a silicon nitrided oxide film are combined. The thickness of the member 35 of which rate of wet etching is small is, for example 50 to 1000 Å, the member 35 may be formed in any position on the member 34 if only the member 34 of which rate of wet etching is large is formed by 200 to 5000 Å, and for example, the member 35 may be formed in the highest position of the insulating layer 3.

A reference number 4 designates a connection hole formed through the insulating layer 3 and provided with a convex portion 10 including the above-described member 35 of which rate of wet etching is small to the side wall 4a. A reference number 5 designates a barrier layer formed on the first electrically conductive layer 2 equivalent to the bottom 4b of the connection hole 4 and the insulating layer 3 and for example, it is a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å or depositing Ti to the thickness of 300 to 30 Å by sputtering. A reference number 6 designates a second electrically conductive layer embedded inside the connection hole 4 and electrically connected to the first electrically conductive layer 2 via the barrier layer 5, and for example, it is a wiring layer consisting of an alloy of Al and Cu of 0.5 wt %. A reference number 9 designates an antireflection film formed on the second electrically conductive layer 6 and for example, it is formed by depositing TiN to the thickness of 200 to 600 Å by sputtering.

Next, referring to FIGS. 22 to 31, a method for manufacturing the semiconductor device constituted as described above will be described. FIGS. 22 to 31 show a process of a semiconductor device according to the third embodiment of the present invention serially.

Figure 22:
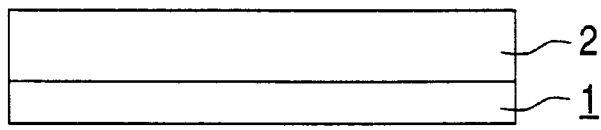
FIG. 22 is a longitudinal section of a main part showing a third embodiment according to the present invention in the order of the process.

First, as shown in FIG. 22, a wiring layer consisting of an alloy of, for example Al and Cu of 0.5 wt % which is a first electrically conductive layer 2 is formed by sputtering on a semiconductor element 1 comprising a conductive impurity diffused layer formed on one main surface of a semiconductor substrate consisting of a silicon substrate and an insulating layer consisting of a silicon oxide film formed on the above-described impurity diffused layer.

Figure 23:
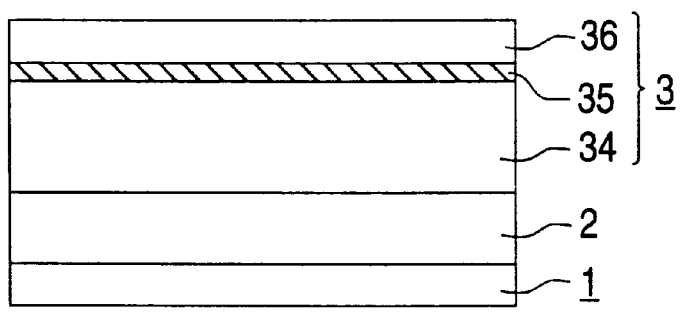
FIG. 23 is a longitudinal section of a main part showing a third embodiment according to the present invention in the order of the process.

Next, as shown in FIG. 23, an insulating layer 3 comprising members 34, 35 and 36 is formed by forming the member 34 of which rate of wet etching is large on the first electrically conductive layer 2, forming the member 35 of which rate of wet etching is small on the member 34 and forming the member 36 of which rate of wet etching is large on the member 35.

In the concrete, the members 34 and 36 of which rate of wet etching is large are formed by a layer insulating film into which a silicon oxide film formed by TEOS or silane by plasma CVD or atmospheric CVD and organic or inorganic SOG are combined. The member 35 of which rate of wet etching is small is formed by a layer insulating film into which a silicon nitride film and a silicon nitrided oxide film are combined.

The member 34 of which rate of wet etching is large is formed so that it is 200 to 5000 Å thick and the member 35 of which rate of wet etching is small formed on the above-described member 34 is formed so that it is 50 to 1000 Å thick. At this time, the member 35 of which rate of wet etching is small may be formed anywhere if only the position is higher than a half of the thickness of the insulating layer 3 and if the member is formed in the above-described position, the member of which rate of wet etching is small may be formed in a plurality of positions with it between the members of which rate of wet etching is large. At this time, the member 35 of which rate of wet etching is small may be formed in the highest position of the insulating layer 3.

Figure 24:
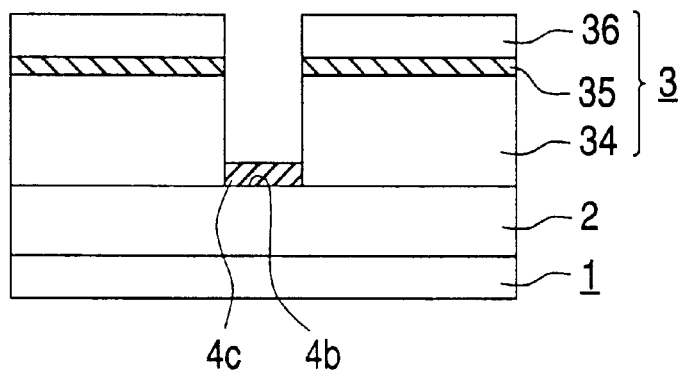
FIG. 24 is a longitudinal section of a main part showing a third embodiment according to the present invention in the order of the process.

Next, as shown in FIG. 24, a connection hole 4 is formed through the above-described insulating layer 3 using a photoengraving process by dry etching such as RIE.

Figure 25:
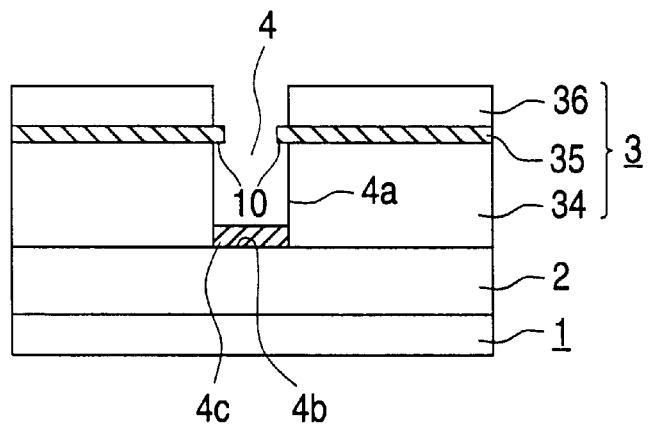
FIG. 25 is a longitudinal section of a main part showing a third embodiment according to the present invention in the order of the process.

Next, wet etching is performed using solution in which hydrofluoric acid, ammonia fluoride and water are mixed or diluted at the rate of "NF:$NH_4F$:$H_2O$=X:Y:100−(X+Y) (however, the unit is %, X=0.2 to 10, Y=20 to 40). At this time, as shown in FIG. 25, as the member 35 of which rate of wet etching is small is less in an etched amount than the members 34 and 36 of which rate of wet etching is large, the side wall 4a of the connection hole 4 is protruded in a convex shape.

Next, after the above-described connection hole 4 is formed, water, nitrogen, hydrogen or other organic substances clinging to the surface of the above-described semiconductor device in a process is removed by heating. In the concrete, they are removed by heating the above-described semiconductor device in a process to the temperature of 150 to 600° C. in high vacuum $10^{-5}$ Torr or less or ambient atmosphere 0.5 to 50 mTorr to of inert gas such as Ar.

If necessary, a natural oxide film 4c formed on the first electrically conductive layer 2 equivalent to the bottom 4b of the connection hole 4 is removed by a process such as sputter etching with high vacuum 10$^{-5}$ Torr or less kept. In the concrete, the film is removed in ambient atmosphere 0.1 to 3 mTorr of Ar at RF power of 100 to 700 W and DC bias of 40 to 600 V.

Figure 26:
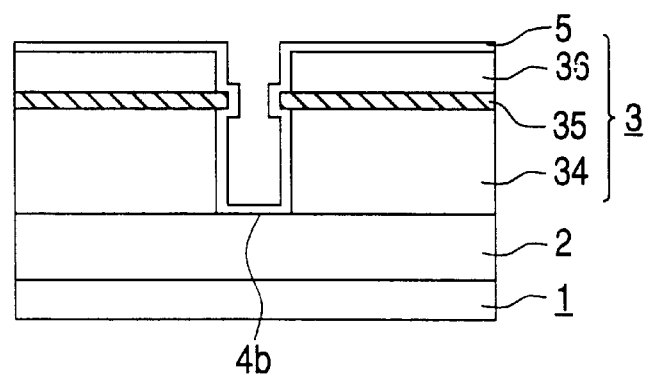
FIG. 26 is a longitudinal section of a main part showing a third embodiment according to the present invention in the order of the process.

Next, as shown in FIG. 26, a barrier layer 5 is formed on the first electrically conductive layer 2 equivalent to the bottom 4b of the connection hole and the insulating layer 3 in vacuum continuity by sputtering. For example, the barrier layer 5 is a barrier metal layer formed by depositing TiN to the thickness of 3000 to 500 Å on Ti deposited to the thickness of 300 to 30 Å, depositing Ti to the thickness of 300 to 30 Å on TiN deposited to the thickness of 3000 to 500 Å on Ti deposited to the thickness of 300 to 30 Å or depositing Ti to the thickness of 300 to 30 Å.

Figure 27:
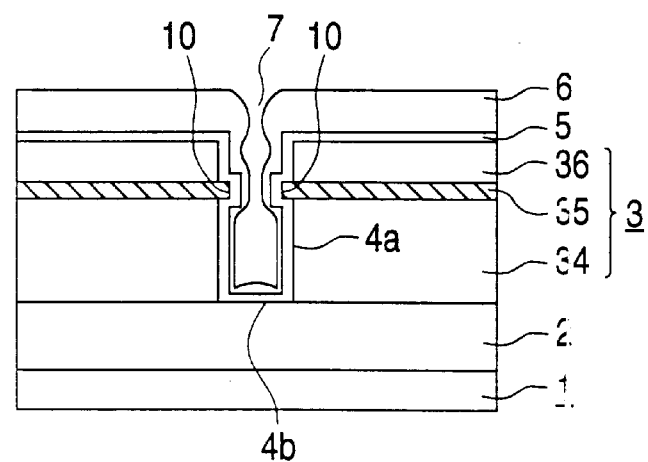
FIG. 27 is a longitudinal section of a main part showing a third embodiment according to the present invention in the order of the process.

Next, as shown in FIG. 27, a second electrically conductive layer 6 consisting of Al and Cu of 0.5% is deposited on the above-described insulating layer 3 and inside the connection hole 4 in vacuum continuity by sputtering.

At this time, the second electrically conductive layer 6 deposited on a side wall 4a and the bottom 4b of the connection hole 4 is generally thinner than the second electrically conductive layer 6 deposited on the insulating layer 3. When the second electrically conductive layer 6 is further deposited by sputtering, a gap 7 between the second electrically conductive layers 6 over the connection hole 4 is blocked, however, at this time, the second electrically conductive layer 6 deposited on the insulating layer 3 is required to be at least twice as thick as the diameter of the connection hole 4 in the highest position.

However, as in the third embodiment according to the present invention, a convex portion 10 is provided to the side wall 4a of the connection hole 4, a sputtered particle is also deposited on this convex portion 10 and as shown in FIG. 16, the gap between the second electrically conductive layers 6 over the connection hole 4 is readily blocked.

When the second electrically conductive layer 6 is further deposited by sputtering, the gap 7 between the second electrically conductive layers 6 over the connection hole 4 is blocked.

Figure 28:
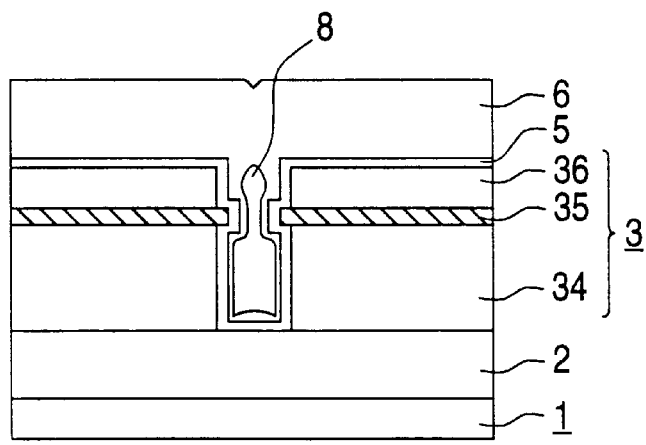
FIG. 28 is a longitudinal section of a main part showing a third embodiment according to the present invention in the order of the process.

Therefore, as shown in FIG. 28, a space 8 is left inside the connection hole 4.

Figure 29:
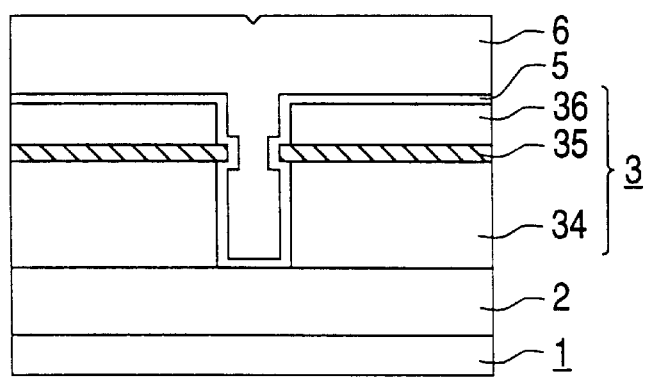
FIG. 29 is a longitudinal section of a main part showing a third embodiment according to the present invention in the order of the process.

The above-described space 8 is removed as shown in FIG. 29 by keeping the second electrically conductive layer 6 in vacuum continuity under high temperature and pressure. In the concrete, the second electrically conductive layer 6 is kept in ambient atmosphere of inert gas such as Ar under the temperature of 300 to 600° C. and pressure of 200 to 900 kg/cm$^2$ for 1 to 20 minutes.

By this, the inside of the connection hole 4 is filled with Al and Cu of 0.5% forming the second electrically conductive layer 6.

Figure 30:
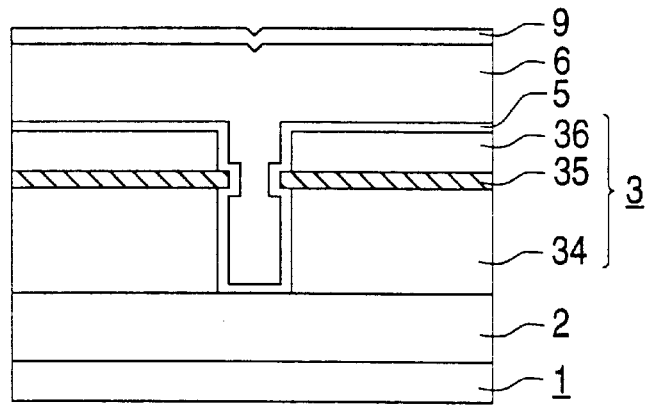
FIG. 30 is a longitudinal section of a main part showing a third embodiment according to the present invention in the order of the process.

Further, if necessary, an antireflection film 9 is formed as shown in FIG. 30 by depositing TiN to the thickness of 200 to 600 Å on the above-described second electrically conductive layer 6 in vacuum continuity by sputtering.

Figure 31:
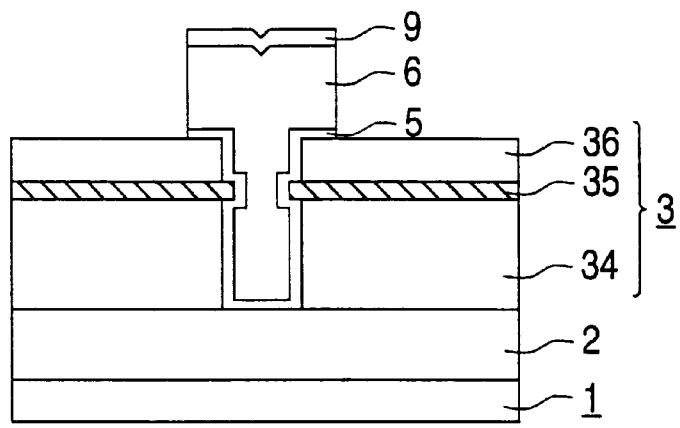
FIG. 31 is a longitudinal section of a main part showing a third embodiment according to the present invention in the order of the process.

Next, as shown in FIG. 31, the barrier layer 5, the second electrically conductive layer 6 and the antireflection film 9 other than around over the connection hole are etched using a photoengraving process by etching such as RIE.

As in the semiconductor device manufactured as described above, the convex portion 10 is provided to the side wall 4a of the connection hole 4, the second electrically conductive layer 6 can be readily embedded in the above-described connection hole 4 by applying high temperature and pressure after the portion over the space 8 is blocked by the second electrically conductive layer 6 formed by sputtering with the space 8 left inside the connection hole 4, and therefore, a characteristic of embedding the second electrically conductive layer 6 in the connection hole 4 is enhanced.

In the third embodiment according to the present invention, the barrier layer 5 is a laminated film of Ti and its nitride, however, it may be a laminated film of an oxide, an oxidized nitride, a carbide, a sulfide or silicide of Ti, or a multilayer film consisting of laminated films.

Further, the barrier layer 5 may be a laminated film of Ta, TiW, W, Mo or a nitride, an oxide, a nitrided oxide, a carbide, a sulfide or silicide of them, or a multilayer film consisting of laminated films.

The barrier layer 5 is formed by sputtering, however, it may be formed by CVD using organic gas including TiCl$_4$ or Ti as material gas.

In such a case, the effect equal to the above-described can be also obtained.

In the third embodiment according to the present invention, the second electrically conductive layer 6 is formed by Al and Cu of 0.5%, however, Cu, Ti, Sc, Pd, Si, Ta, Mn, Mg, Nb, Cr, Co, Ni, Ag, Pt, W, Au or V for 0.01 to 2% for Al may be used in place of Cu of 0.5% and two or more of the above-described elements for 0.01 to 2% respectively for Al may be used.

Further, Cu, Ag or Pt may be used as a main component of the second electrically conductive layer 6 in place of Al.

In addition, the second electrically conductive layer 6 may be formed by only Cu, Al or Pt.

In such a case, the effect equal to the above-described can be also obtained.

In the third embodiment according to the present invention, the first electrically conductive layer 2 is a wiring layer formed on the semiconductor element 1, however, it may be a layer in which B, P or As is diffused formed on one main surface of a semiconductor substrate consisting of a silicon substrate. In this case, the members 34 and 36 of which rate of wet etching is large in the insulating layer 3 may be a silicon oxide film formed by TEOS or silane by thermal CVD, a thermal oxide film formed using gas including oxygen, a silicon oxide film and a silicon nitride film such as BPSG and BPTEOS including B and P, or may be a laminated film of these.

In such a case, the effect equal to the above-described can be also obtained.

In the third embodiment according to the present invention, the second electrically conductive layer 6 is formed in vacuum continuity by sputtering after the barrier layer 5 is formed, however, after the barrier layer 5 is formed, the above-described semiconductor device in a process may be exposed to atmospheric pressure, may be annealed and degassed, and if necessary, the second electrically conductive layer 6 may be formed by sputtering after sputter etching and forming a barrier layer again.

In the concrete, the semiconductor device in a process is annealed in ambient atmosphere of, for example N$_2$, O$_2$, NH$_3$ or gas in which two or more of these are mixed at the temperature of 450 to 900° C. for 10 to 300 seconds in the case of rapid thermal anneal or for 10 to 120 minutes in the case of furnace anneal.

After the barrier layer 5 is formed, the semiconductor device in a process may be also annealed in vacuum continuity.

In such a case, the effect equal to the above-described can be also obtained.

In the third embodiment according to the present invention, the antireflection film 9 is formed by depositing TiN to the thickness of 200 to 600 Å, however, it may be formed by depositing TiN or Ti to the thickness of 200 to 600 Å and may be formed by Ti, Ta, TiW, W, Si or a nitride, an oxide, an oxidized nitride of them.

The antireflection film may be formed by CVD in place of sputtering.

In such a case, the effect equal to the above-described can be also obtained.

Fourth Embodiment

A fourth embodiment according to the present invention is different from the first embodiment in that for sputtering for forming a second electrically conductive layer, an interval between the surface of the target to be sputtered and the surface of an insulating layer is set to 10 to 50 mm, is different from the first embodiment in that in the fourth embodiment, an angular aperture of a connection hole is not limited and in the first embodiment, it is set to 85 to 100°, and in other respects, the fourth embodiment is the same as the above-describe first embodiment.

The fourth embodiment according to the present invention is the same as the first embodiment except steps shown in FIGS. 2 and 5 and except that in the fourth embodiment, an angular aperture θ of a connection hole 4 is not limited to 85 to 100°. The fourth embodiment is the same as the first embodiment in steps shown in FIGS. 6 and 7 and in that a second electrically conductive layer 6 is formed by sputtering. It is also the same in steps shown in FIGS. 8 and 10.

Figure 32:
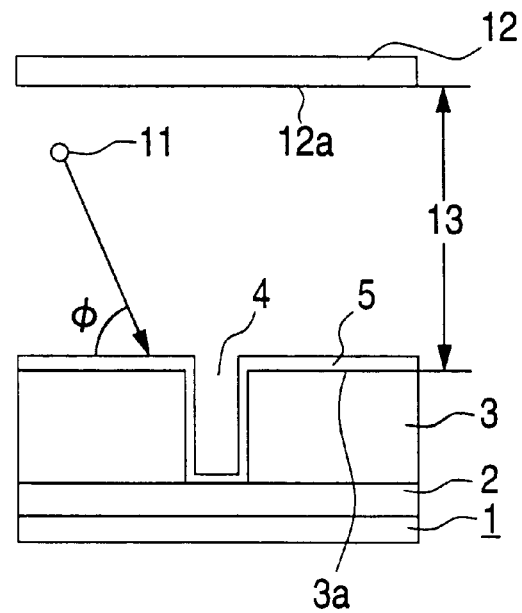
FIG. 32 shows sputtering in a fourth embodiment according to the present invention.

However, the fourth embodiment is different from the first embodiment in that in the steps shown in FIGS. 6 and 7, the condition of sputtering used in them is limited as described below. Referring to FIG. 32, this limitation will be described below.

Reference numbers 1 to 5 in FIG. 32 designate the same things as in the first embodiment. A reference number 3a designates the surface of an insulating layer 3, a reference number 11 designates a sputtered particle and "φ" designates an angle of incidence of a sputtered particle 11 in case the surface 3a of the insulating layer is the reference. A reference number 12 designates a sputter target and 12a designates the surface of the sputter target. A reference number 13 designates a distance between the surface 12a of the sputter target and the surface 3a of the insulating layer and in the fourth embodiment, the distance is set to 10 to 50 mm.

As in the fourth embodiment according to the present invention, the distance 13 between the surface 12a of the sputter target and the surface 3a of the insulating layer is set to 10 to 50 mm, the ratio of particles 11 sputtered at an incident angle φ other than a perpendicular one to the surface 3a of the insulating layer is larger than in a case using normal sputtering in which the above-described distance is approximately 60 mm, and as a result, a gap 7 between second electrically conductive layers 6 over a connection hole 4 is readily blocked. Therefore, after a portion over a space 8 is blocked by the second electrically conductive layer 6 formed by sputtering with the space 8 left inside the connection hole 4, the second electrically conductive layer 6 can be readily embedded in the above-described connection hole 4 by applying high temperature and pressure, and a characteristic of embedding the second electrically conductive layer 6 in the connection hole 4 is enhanced.

Fifth Embodiment

A fifth embodiment according to the present invention is different from the first embodiment in that in the fifth embodiment, pressure in sputtering for forming a second electrically conductive layer is set to 10 to 100 mTorr and in that in the fifth embodiment, an angular aperture of a connection hole is not limited, whereas in the first embodiment, it is set to 85 to 100°, however, in other respects, the fifth embodiment is the same as the first embodiment.

The fifth embodiment is the same as the first embodiment except steps shown in FIGS. 2 and 5 and except that in the fifth embodiment, an angular aperture θ of the connection hole 4 is not limited to 85 to 100°. The fifth embodiment is the same as the first embodiment in steps shown in FIGS. 6 and 7 and in that the second electrically conductive layer 6 is formed by sputtering. The fifth embodiment is also the same as the first embodiment in steps shown in FIGS. 8 and 10.

Figure 33:
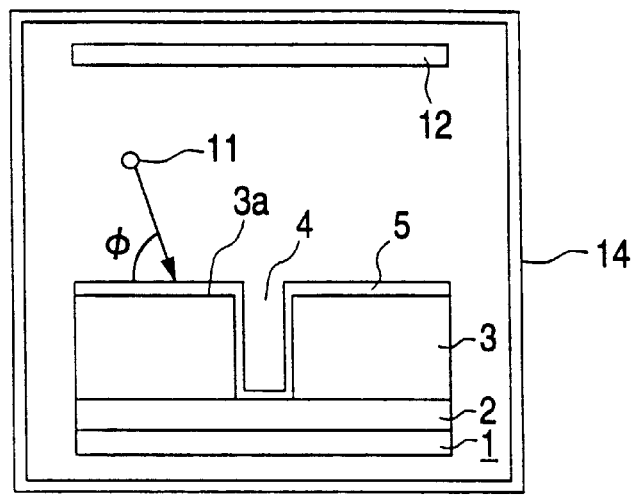
FIG. 33 shows sputtering in a fifth embodiment according to the present invention.

However, the fifth embodiment is different from the first embodiment in that in the fifth embodiment, a condition of sputtering used in steps shown in FIGS. 6 and 7 is limited as described below. Referring to FIG. 33, this respect will be described below.

Reference numbers 1 to 5 in FIG. 33 are the same as them in the first embodiment. A reference number 3a designates the surface of an insulating layer 3, a reference number 11 designates a sputtered particle and "φ" designates an angle of incidence of a sputtered particle 11 in case the surface 3a of the insulating layer is the reference. A reference number 12 designates a sputter target and 14 designates a vacuum chamber in which the second electrically conductive layer 6 is deposited by sputtering. In the fifth embodiment, pressure in the vacuum chamber is set to 10 to 100 mTorr.

As in the fifth embodiment, pressure in the vacuum chamber is set to 10 to 100 mTorr, the ratio of particles 11 sputtered at an incident angle φ other than a perpendicular one to the surface 3a of the insulating layer is large and a gap 7 between the second electrically conductive layers 6 over the connection hole 4 is readily blocked. Therefore, after a portion over a space 8 is blocked by the second electrically conductive layer 6 formed by sputtering with the space 8 left inside the connection hole 4, the second electrically conductive layer 6 can be readily embedded in the above-described connection hole 4 by applying high temperature and pressure and a characteristic of embedding the second electrically conductive layer 6 in the connection hole 4 is enhanced.

Sixth Embodiment

A sixth embodiment according to the present invention is different from the first embodiment in that in the sixth embodiment, the surface of a sputter target in sputtering for forming a second electrically conductor consists of 110 faces and in that in the sixth embodiment, an angular aperture of a connection hole is not limited, whereas in the first embodiment, it is set to 85 to 100°, and in other respects, the sixth embodiment is the same as the first embodiment.

The sixth embodiment is the same as the first embodiment except steps shown in FIGS. 2 and 5 and except that in the sixth embodiment, an angular aperture θ of the connection hole 4 is not limited to 85 to 100°. The sixth embodiment is the same as the first embodiment in steps shown in FIGS. 6 and 7 and in that the second electrically conductive layer 6 is formed by sputtering. The sixth embodiment is also the same as the first embodiment in steps shown in FIGS. 8 and 10.

Figure 34:
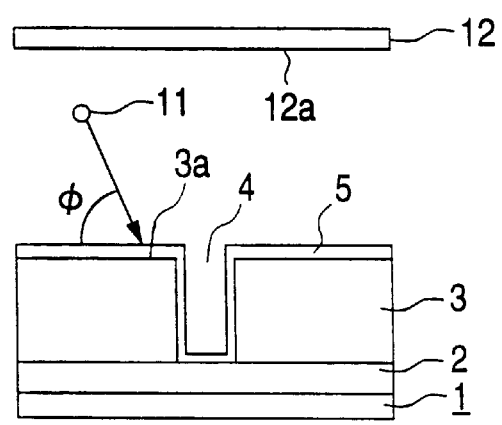
FIG. 34 shows sputtering in a sixth embodiment according to the present invention.
Figure 35:
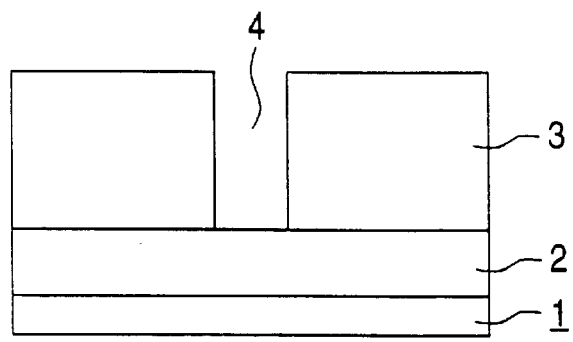
FIG. 35 is a longitudinal section of a main part showing a method for manufacturing the conventional semiconductor device in the order of a process.
Figure 36:
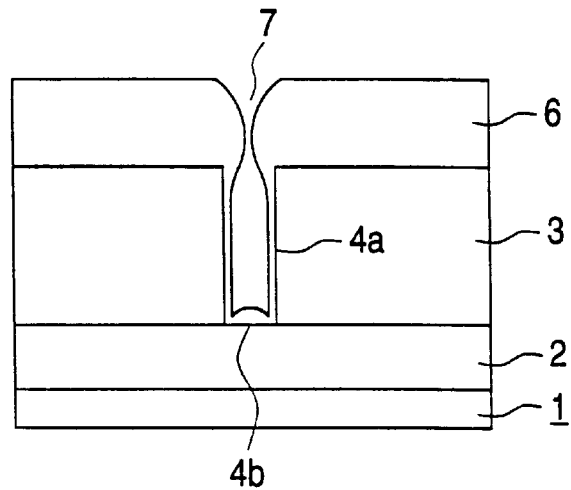
FIG. 36 is a longitudinal section of a main part showing a method for manufacturing the conventional semiconductor device in the order of a process.
Figure 37:
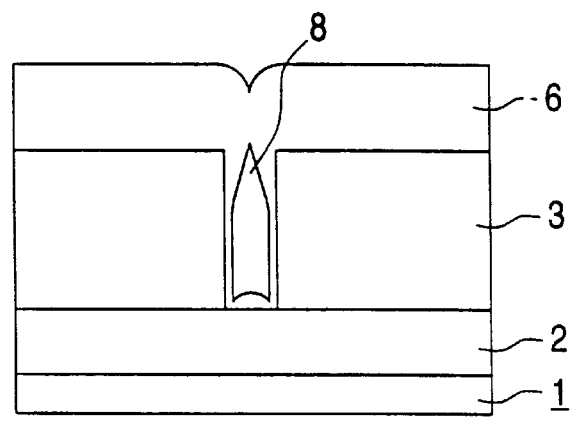
FIG. 37 is a longitudinal section of a main part showing a method for manufacturing the conventional semiconductor device in the order of a process.
Figure 38:
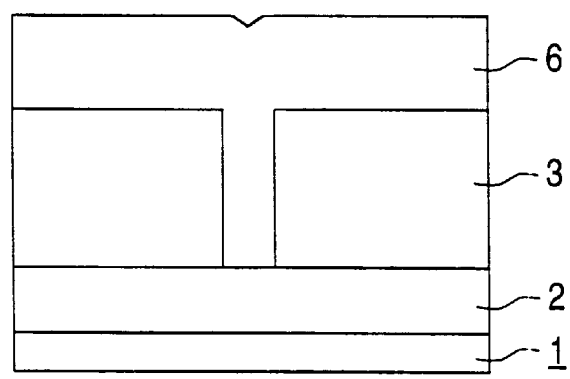
FIG. 38 is a longitudinal section of a main part showing a method for manufacturing the conventional semiconductor device in the order of a process.

However, the sixth embodiment is different from the first embodiment in that a condition of sputtering used in steps shown in FIGS. 6 and 7 is limited as described below. Referring to FIG. 34, this respect will be described below.

Reference numbers 1 to 5 in FIG. 34 are the same as them in the first embodiment. A reference number 3a designates the surface of an insulating layer 3, a reference number 11 designates a sputtered particle and "ϕ" designates an angle of incidence of a sputtered particle 11 in case the surface 3a of the insulating layer is the reference. A reference number 12 designates a sputter target and 12a designates the surface of the sputter target. In the sixth embodiment, the surface 12a of the above-described sputter target consists of 110 faces.

As in the sixth embodiment, the surface 12a of the sputter target consists of 110 faces, the ratio of particles 11 sputtered at an incident angle θ other than a perpendicular one to the surface 3a of the insulating layer is large and a gap 7 between the second electrically conductive layers 6 over the connection hole 4 is readily blocked. Therefore, after a portion over a space 8 is blocked by the second electrically conductive layer 6 formed by sputtering with the space 8 left inside the connection hole 4, the second electrically conductive layer 6 can be readily embedded in the above-described connection hole 4 by applying high temperature and pressure and a characteristic of embedding the second electrically conductive layer 6 in the connection hole 4 is enhanced.

The present invention provides a semiconductor device according to the present invention an effect that a characteristic of embedding a second electrically conductive layer in a connection hole formed through an insulating layer for electrically connecting a first electrically conductive layer and the second electrically conductive layer over the first electrically conductive layer through the insulating layer is enhanced.

The present invention provides a method for manufacturing a semiconductor device according to the present invention an effect that a characteristic of embedding a second electrically conductive layer in a connection hole formed through an insulating layer for electrically connecting a first electrically conductive layer and the second electrically conductive layer over the first electrically conductive layer through the insulating layer is enhanced.

What is claimed is:

1. A semiconductor device, comprising:

a first electrically conductive layer formed on a semiconductor element or on one main surface of a semiconductor substrate;

an insulating layer having a lower surface formed on said first electrically conductive layer, said insulating layer having an upper surface with a connection hole having an upper opening in the upper surface, said connection hole having a side wall extending from the upper opening to a lower opening in the lower surface, wherein the side wall is provided with a convex portion configured to provide a smallest size connection hole opening relative to any other portion of the side wall, said convex portion being formed at a position spaced from the upper surface but closer to the upper surface than to the lower surface of the insulating layer;

a second electrically conductive layer formed on the upper surface of said insulating layer and filling said connection hole; and further wherein said insulating layer includes a plurality of insulating members with different etching rates and a part of said convex portion on said side wall of said connection hole comprises a central part having an etching rate which is slower than an etching rate of parts of the side wall sandwiching the central part.

2. The semiconductor device according to claim 1, wherein:

said first electrically conductive layer comprises at least one of a wiring layer and a conductive diffusion layer.

3. The semiconductor device according to claim 1, wherein:

said second electrically conductive layer comprises a wiring layer.

4. The semiconductor device according to claim 2, wherein:

said first electrically conductive layer comprises a metallic film.

5. The semiconductor device according to claim 3, wherein:

said second electrically conductive layer comprises a metallic film.

6. The semiconductor device according to claim 1, wherein:

a barrier layer is formed on the bottom of said connection hole.

7. The semiconductor device according to claim 1, wherein:

an antireflection film is formed on an upper portion of said second electrically conductive layer.

8. The semiconductor device according to claim 1, wherein:

a barrier layer is formed on the side wall of said connection hole and on the bottom of said connection hole.

9. The semiconductor device according to claim 1, wherein:

said insulating layer includes at least three different insulating members.

* * * * *